United States Patent [19]

Suzuki et al.

[11] Patent Number: 4,651,190

[45] Date of Patent: Mar. 17, 1987

[54] SEMICONDUCTOR INTEGRATED CIRCUIT

[75] Inventors: Hiroaki Suzuki, Yokohama; Teruo Kobayashi, Tokyo, both of Japan

[73] Assignee: Kabushiki Kaisha Toshiba, Japan

[21] Appl. No.: 788,254

[22] Filed: Oct. 17, 1985

[30] Foreign Application Priority Data

Oct. 22, 1984 [JP] Japan ................ 59-221665

[51] Int. Cl.$^4$ .................................... H01L 27/10
[52] U.S. Cl. ............................ 357/45; 357/23.1; 357/41; 357/42
[58] Field of Search ................ 357/23, 41, 42, 45

[56] References Cited

U.S. PATENT DOCUMENTS 4,288,804  3/1986  Kikuchi et al. ................ 357/42
4,516,312  5/1985  Tomita ............................ 357/23.6

OTHER PUBLICATIONS

Bansal-IBM Tech. Bul.–vol. 26, No. 5, Oct. 1983, pp. 2404–2407, "CMOS (N–Well) Master Image Chip".
Takechi et al., "A CMOS 12K–Gate Array With Flexible 10KB Memory", IEEE International Solid-State Circuits Conference, ISSCC Digest of Technical Papers, pp. 258–259, Feb. 24, 1984.

Primary Examiner—Edward J. Wojciechowicz
Attorney, Agent, or Firm—Finnegan, Henderson, Farabow, Garrett & Dunner

[57] ABSTRACT

A semiconductor integrated circuit includes p- and n-type semiconductor areas alternately arranged in a row direction, p-channel MOS transistor blocks arranged in each of the p-type semiconductor areas and each including two p-channel MOS transistors, n-channel MOS transistor blocks arranged in each of the n-type semiconductor areas and each including two n-channel MOS transistors, and p- and n-type diffusion areas formed, respectively, in each of the p-type semiconductor areas and in each of the n-type semiconductor areas. The MOS transistor blocks are arranged on two columns in each of the p- and n-type semiconductor areas, and each of the diffusion areas is formed in a position defined by the gate electrodes of four MOS transistors of the same channel type in the two MOS transistor blocks adjacent to each other in a row direction.

7 Claims, 7 Drawing Figures

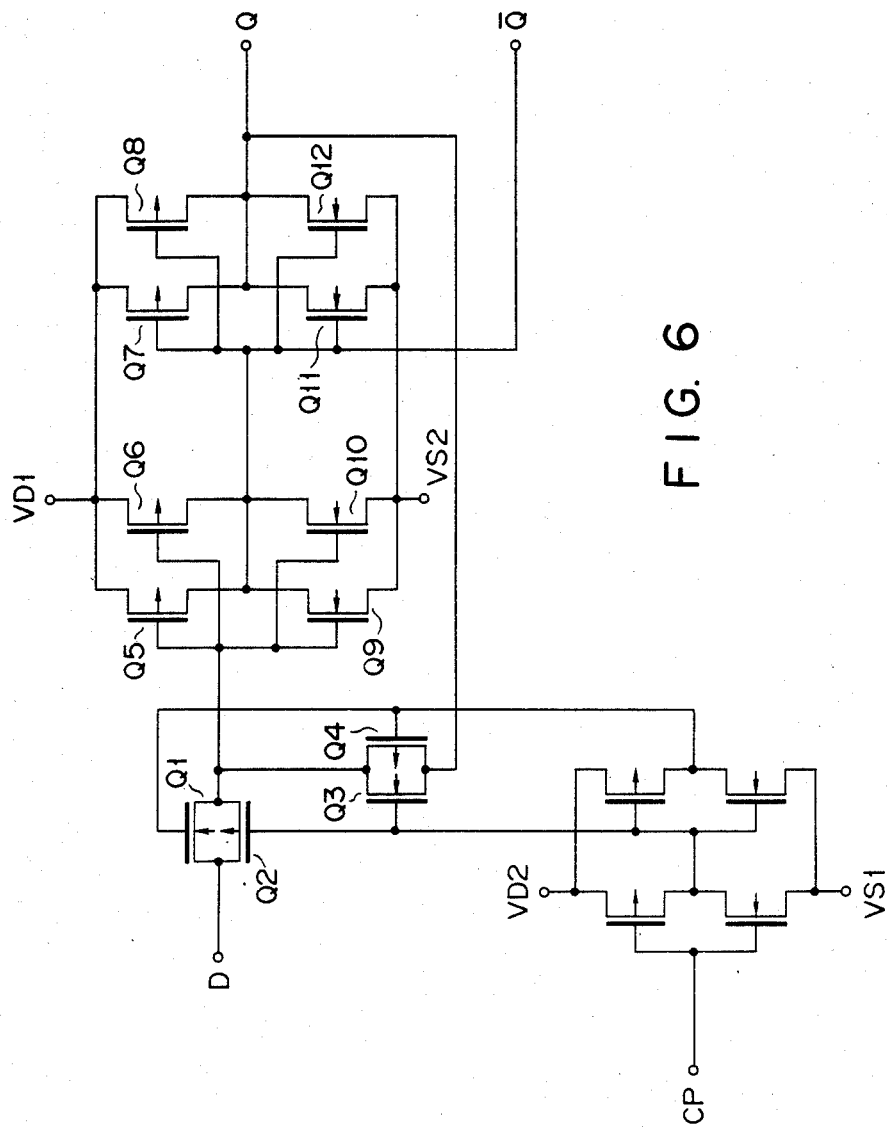
F I G. 6

SEMICONDUCTOR INTEGRATED CIRCUIT

BACKGROUND OF THE INVENTION

The present invention relates to a semiconductor integrated circuit including a CMOS gate array.

Hitherto, in large scale integrated (LSI) circuits, gate array chips constituted in such a manner that transistors or cells are arranged over substantially the entire surface of a master chip without preliminary allotment of a specified region for wiring, have been known. In such a gate array chip, the area ratio between the wiring region and the cell region can almost be arbitrarily selected in the circuit connection step. Therefore, in such a gate array chip the area ratio between the wiring region and the cell region can be properly set in accordance with the kinds of circuit systems to be formed. Namely, in the case of a circuit system having a small number of or a small area for the wirings in contrast to the number of cells, a large cell region is set. In contrast, in the case of a circuit system having a large number of wirings or a large area for the wirings in contrast to the number of cells, a small cell region is set. Therefore, the whole gate array chip can be efficiently used.

In partial gate-type gate array chips in which the wiring region is preliminarily allotted independent of the cell region, transistors or cells are formed in the preliminarily defined cell region, so that a RAM, a ROM, a PLA, or the like cannot be formed with a high degree of density. However, in full gate-type gate array chips in which cells are formed over the whole surface, the wiring region which requires a large area is not preliminarily allotted. Instead, this wiring region is selectively allotted in accordance with the circuit to be formed, the advantage being that a circuit such as a RAM, a ROM, or a PLA, etc. can be formed with high density. Therefore, it is necessary to design the structure of the cell carefully in order to make full use of this advantage.

The following conditions are required to make the best of the advantage of the full gate-type gate array chip.

(1) Transistors or cells must be formed with a high degree of density.

(2) In full gate-type gate array chips, the stray capacitance existing between the metal wiring and the substrate or transistor formed under this metal wiring is larger than that in partial-gate type gate array chips. Therefore, to improve the operating speed, a transistor having a large load driving capability needs to be formed.

(3) Although the width of the wiring region is variable, it is constituted step by step and therefore the width of this wiring region must be finely altered.

FIGS. 1 to 3 show parts of patterns of conventional full gate-type gate array chips having a plurality of basic cell arrays arranged like a matrix. However, the basic cell arrays used in these chips do not sufficiently satisfy the above-mentioned three conditions.

In the gate array chip pattern shown in FIG. 1, the basic cell array surrounded by the broken line includes a pair of p-channel MOS transistors TP1 and TP2, and a pair of n-channel MOS transistors TN1 and TN2. The p-channel MOS transistors TP1 and TP2 have $p^+$-type impurity regions 1 to 3 formed in an n-type substrate and serving as source and drain regions, as well as gate electrodes G1 and G2 arranged in parallel with each other. The impurity region 2 is used as a drain region of one of the MOS transistors TP1 and TP2, and is simultaneously used as a source region of the other of the MOS transistors TP1 and TP2. The n-channel MOS transistors TN1 and TN2 have $n^+$-type impurity regions 4 to 6 formed in a p-type substrate and serving as source and drain regions, and gate electrodes G3 and G4 arranged in parallel with each other. The impurity region 4 is used as a drain region of one of the MOS transistors TN1 and TN2 and is simultaneously used as a source region of the other of the MOS transistors TN1 and TN2.

The gate electrodes G1 and G2 where is the other hand are arranged on the same line as the gate electrodes G3 and G4, respectively. As described above, in this gate array chip, MOS transistors of the same type are formed on the same column, while p- and n-channel MOS transistors are alternately arranged on the same row. In the diagrams, a plurality of dots arranged in a matrix are drawn to express the dimensions of each element. The distance between two adjacent dots is one grid, or about 5 μm.

Generally, in integrated circuits, the reference potential region is formed in each substrate region to maintain the substrate potential at a reference potential level. In FIG. 1, these reference potential regions are shown as diffusion regions 7-1 and 7-2, which are formed to have the same conductivity type as the substrate regions, that is, n- and p-type conductivity types, and to extend in the column direction closest to the basic cell arrays on the same column. In order to provide spaces for the diffusion regions 7-1 and 7-2, it is required to separate the adjacent basic logic cell arrays from each other by about two grids in the row direction.

FIG. 2 shows the pattern of a gate array chip which is substantially the same as that shown in FIG. 1, except that two diffusion regions 8-1 and 8-2, forming the reference potential regions, are arranged on a line in the row direction in each basic cell array. In the basic cell array of the gate array chip shown in FIG. 2, as compared with that shown in FIG. 1, the dimension in the row direction can be reduced by one grid, while the dimension in the column direction is enlarged by one grid.

FIG. 3 shows the pattern of a gate array chip in which two diffusion regions 9-1 and 9-2 forming the reference potential regions are arranged between the gate electrodes G1 and G2, and between the gate electrodes G3 and G4 in each basic cell array. In this basic cell array of the gate array chip, separation of the diffusion regions 9-1 and 9-2 from the drain or source region of the MOS transistor is necessary. Therefore, in order to provide the space to form the diffusion regions 9-1 and 9-2, it is necessary to elongate the gate electrode of each MOS transistor by one grid in the row direction, as compared with that shown in FIGS. 1 or 2.

As described above, in the gate array chips shown in FIGS. 1 to 3, in order to provide the spaces to form the diffusion regions 7-1, 7-2 to 9-1, 9-2, the dimension in the row or column direction of each basic cell array is enlarged.

SUMMARY OF THE INVENTION

It is an object of the present invention to provide a semiconductor integrated circuit in which, by forming a reference potential setting region in each basic cell array without enlarging the dimension of each basic cell array, the degree of integration is improved.

This object is accomplished by a semiconductor integrated circuit comprising a plurality of p- and n-type semiconductor areas alternately arranged in a row direction; a plurality of p-channel MOS transistor blocks formed on a plurality of columns in each of the n-type semiconductor areas, each of these p-channel MOS transistor blocks having a plurality of p-channel MOS transistors which are serially connected and whose gate electrodes are independently formed; a plurality of n-channel MOS transistor blocks formed on a plurality of columns in each of the p-type semiconductor areas, each of these n-channel MOS transistor blocks having a plurality of n-channel MOS transistors which are serially connected and whose gate electrodes are independently formed; a plurality of n-type regions which are each formed in a position surrounded by the gate electrodes of the p-channel MOS transistors in two of the p-channel MOS transistor blocks, adjacent to each other in a row direction, in each of the n-type semiconductor areas; and a plurality of p-type regions which are each formed in a position surrounded by the gate electrodes of the n-channel MOS transistors in two of the n-channel MOS transistor blocks adjacent to each other in a row direction in each of the p-type semiconductor areas.

In this invention, since MOS transistor blocks of the same channel are arranged adjacently in a row direction, each of the p- or n-type regions used to fix the substrate potential can be formed in the area surrounded by the gate electrodes of four MOS transistors of the same channel. Therefore, the p- or n-type regions can be formed in each of the basic cell arrays without enlarging the size of the basic cell array.

BRIEF DESCRIPTION OF THE DRAWINGS

FIG. 6 is an equivalent circuit diagram of the latch circuit device shown in FIG. 5.

DETAILED DESCRIPTION OF THE PREFERRED EMBODIMENT

Figure 4:
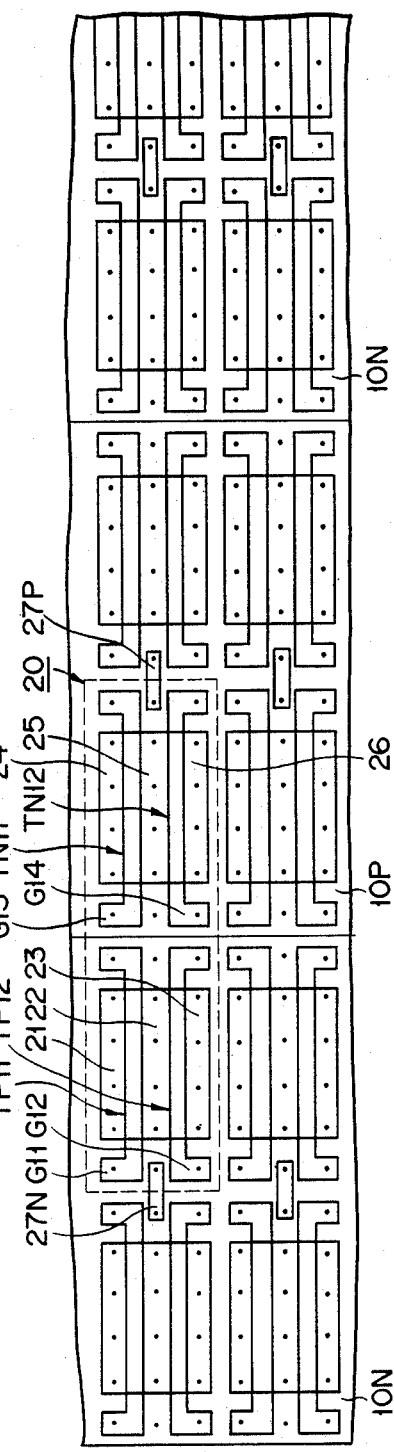
FIG. 4 shows a gate array chip pattern including substrate potential setting regions according to one embodiment of the present invention.

FIG. 4 shows a CMOS gate array according to one embodiment of the present invention. This CMOS gate array includes n- and p-type substrate regions 10N and 10P which extend in the column direction and are alternately formed in the row direction. In each of the n-type substrate regions 10N, a plurality of p-channel MOS transistors are formed in two columns. In each of the p-type substrate regions 10P, a plurality of n-channel MOS transistors are formed on two columns. These p- and n-channel MOS transistors are formed in a matrix in such a manner that their current paths are parallel in the column direction.

In such a full-gate type gate array chip, each basic cell is constituted by a pair of p-channel MOS transistors on a certain column, and a pair of n-channel MOS transistors on an adjacent column, which face the pair of p-channel MOS transistors. For example, a basic cell 20 is constituted by a pair of p-channel MOS transistors TP11 and TP12 formed on the right column of the substrate region 10N, and n-channel MOS transistors TN11 and TN12 formed on the left column of the substrate region 10P adjacent to the substrate region 10N to face the p-channel MOS transistors TP11 and TP12. The p-channel MOS transistors TP11 and TP12 have $p^+$-type regions 21 to 23 formed in the n-type substrate region 10N and serving as source and drain regions, and a pair of gate electrodes G11 and G12 formed to extend in parallel with each other in the row direction.

The $p^+$-type region 22 functions as a drain region of one of the p-channel MOS transistors TP11 and TP12, and simultaneously acts as the source region of the other MOS transistor TP11 or TP12. The n-channel MOS transistors TN11 and TN12 have $n^+$-type regions 24 to 26 formed in the p-type substrate region 10P and serve as source and drain regions, and a pair of gate electrodes G13 and G14 formed to extend in parallel with each other in the row direction. The $n^+$-type region 25 functions as a drain region of one of the n-channel MOS transistors TN11 and TN12, and simultaneously acts as a source region of the other MOS transistor TN11 or TN12.

To prevent the latch-up phenomenon peculiar to CMOS LSI, n- and p-type diffusion regions 27N and 27P, which are used to set the potentials of the substrate regions 10N and 10P at fixed potential levels, are formed in the surface areas of the substrate regions 10N and 10P, respectively. The n-type diffusion region 27N is formed in the area surrounded by the gate electrodes G11 and G12 of the pair of p-channel transistors TP11 and by TP12 and the gate electrodes of the pair of p-channel transistors formed in the same substrate region 10N to face the transistors TP11 and TP12. The p-type diffusion region 27P is formed in the area surrounded by the gate electrodes G13 and G14 of the pair of n-channel transistors TN11 and by TN12 and the gate electrodes of the pair of n-channel transistors formed in the same substrate region 10P to face the transistors TN11 and TN12. In other words, the diffusion region 27N or 27P can be arranged in the area surrounded by the form contact portions of the gate electrodes of the four MOS transistors of the same channel which are formed closely with one another. This arrangement can be realized because the MOS transistors of the same channel are formed on the adjacent columns in the same substrate region 10N or 10P.

In the gate array chip shown in FIG. 4, the diffusion regions 27N and 27P can be arranged without increasing the size of the basic cell, and the degree of integration of the transistor circuit can be improved. In addition, as compared with an ordinary logic circuit, special circuits such as a RAM, a ROM, a PLA, etc., in which the element connection or metalization is simple, can be formed with a high degree of density.

In the case of forming ordinary gate circuits other than the RAM, ROM and PLA over the master chip using the gate array chip shown in FIG. 4, the cell region and wiring region are first divided and thereafter the metalization similar to the metalization executed upon formation of an ordinary gate array is executed. In this case, by executing optimum metalization the macro cell or basic logic circuit is reduced in size and the gate circuits are formed so as to have a high load driving capability. Generally, in the case of forming a cell transistor in accordance with computer aided design, the size of four to six grids is allocated for the source and drain regions of the cell transistor.

Figure 1:
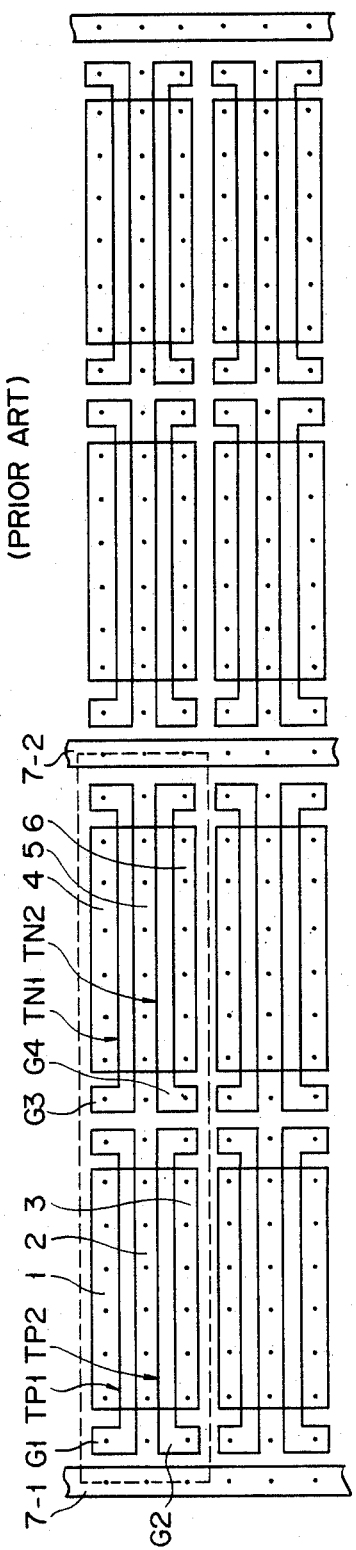
FIGS. 1 to 3 show gate array chip patterns in which substrate potential setting regions for attaining stable substrate potentials are formed.
Figure 2:
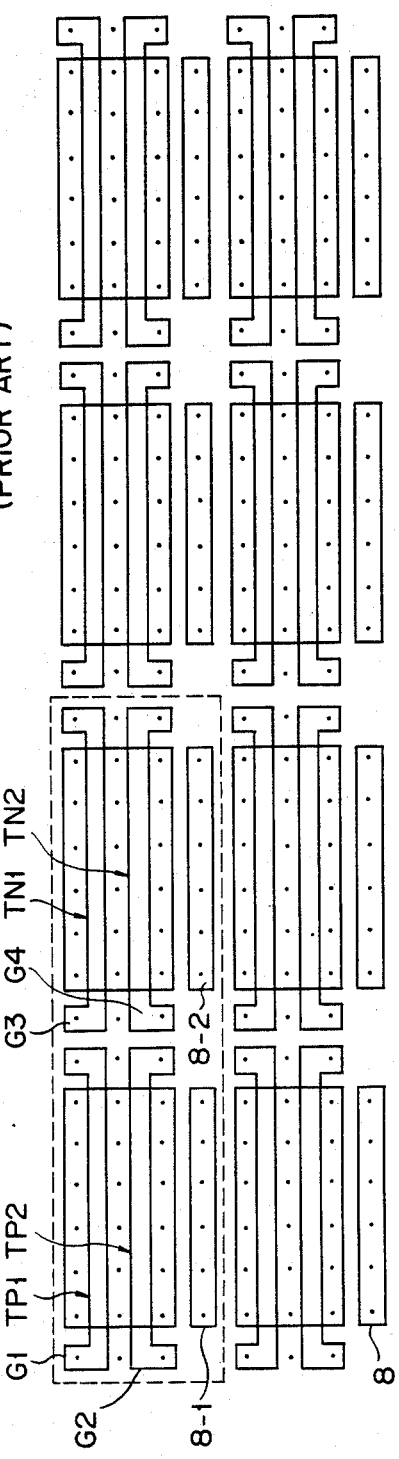
Figure 3:
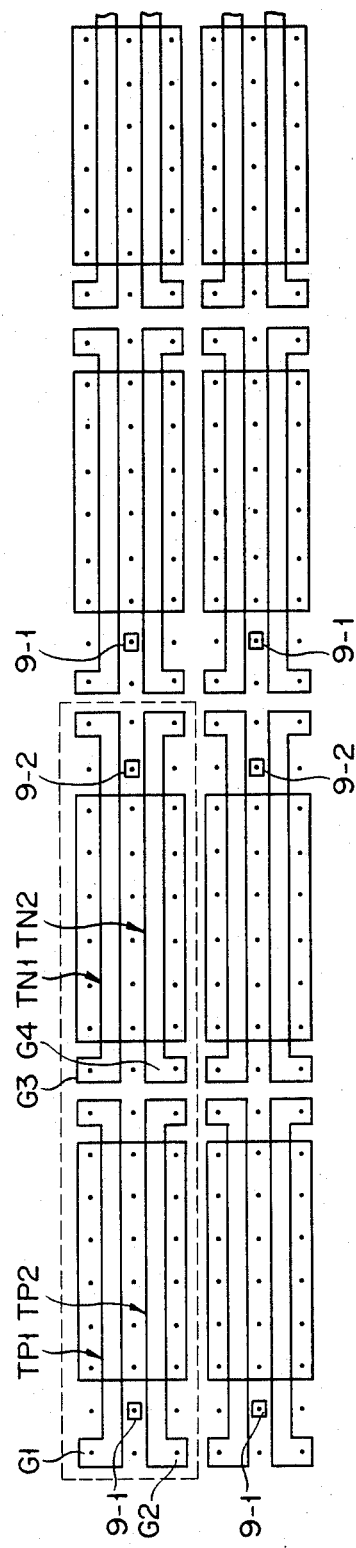

In addition, in the full-gate type gate array, the parasitic capacitance in association with the metal wiring becomes large, so that the cell transistor must have a high load driving capability so as to function correctly irrespective of the influence of this parasitic capacitance. For this purpose, the cell transistor must have a wide current path, for example, six grids in width. For instance, in the conventional gate array shown in FIGS. 1 and 3, the width of the current path of the cell transistor is set to six grids and the width of each basic cell is set to eighteen grids. In contrast, in the gate array shown in FIG. 4, a small-sized macro cell can be formed by use of the basic cell and half of each of the p- and n-channel MOS transistors which are located on both sides of this basic cell.

Figure 5:
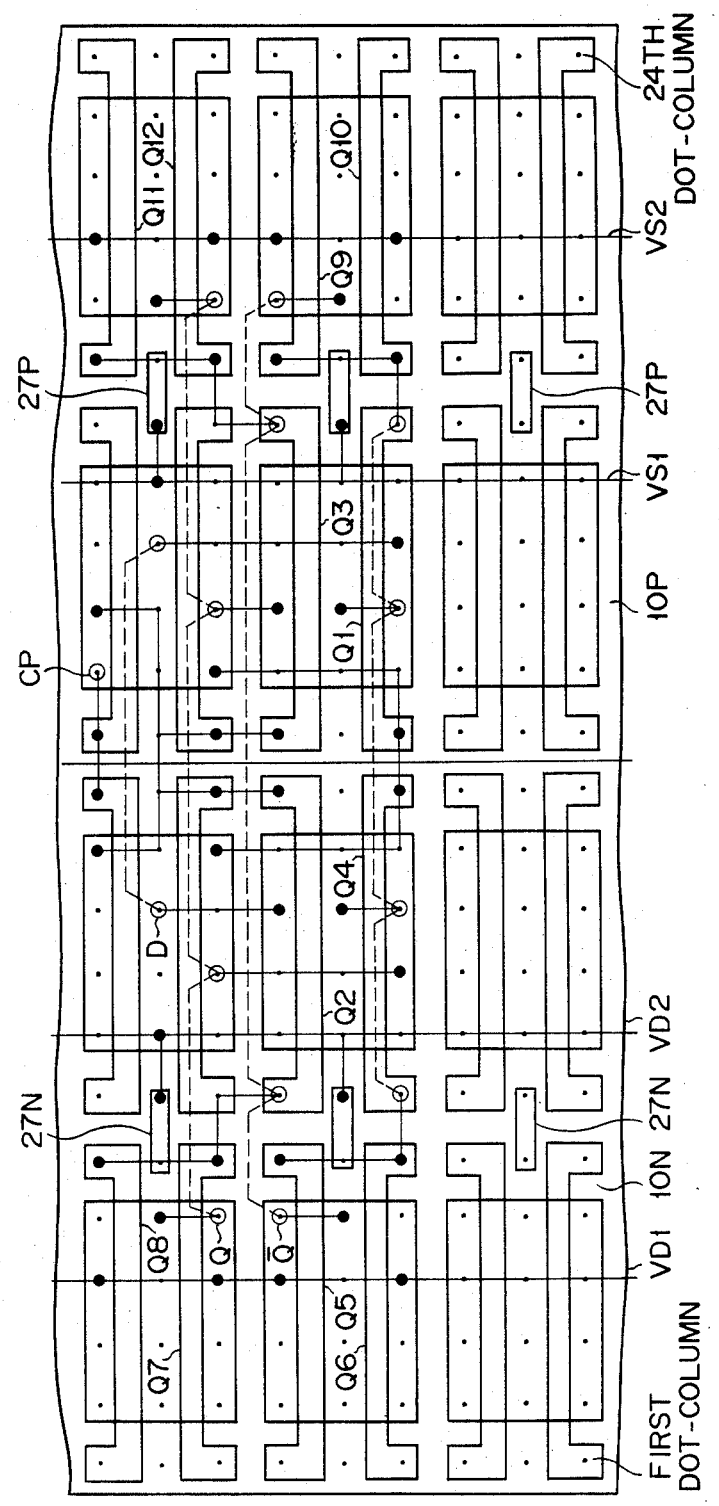
FIG. 5 is an arrangement diagram of a latch circuit device formed by use of the gate array chip pattern shown in FIG. 4.

FIG. 5 shows an arrangement of a latch circuit device formed using a part of the gate array shown in FIG. 4. FIG. 6 shows an equivalent circuit of the latch circuit device of FIG. 5. In this case, the metalization is executed by way of the metal wirings of the upper and lower layers which are insulated from each other. In FIG. 5, larger black dots on the dots arranged in a matrix indicate contact areas formed to connect the metal wirings of the lower layer, shown by the solid lines, to the drain, source and diffusion regions formed in the substrate region, or to the polysilicon layer of the gate electrodes. On the other hand, circles surrounding the dots represent contact areas formed to connect the metal wirings of the upper layer with the metal wirings, indicated by the broken lines, of the lower layer.

In the gate array in FIG. 5, first to twenty-fourth dot-columns are provided and each MOS transistor is formed to have a current path with a width of four grids. The MOS transistors between the eighth and seventeenth dot-columns constitute the basic cell. Also, positive power supply lines VD1 and VD2 are formed on the fourth and eighth dot-columns, respectively. Negative power supply lines VS1 and VS2 are formed on the seventeenth and twenty-first dot-columns, respectively. The macro cell can be constituted in the region sandwiched by the fourth and twenty-first dot-columns. Thus, the other regions, namely, the region between the first and fourth dot-columns and the region between the twenty-first and twenty-fourth dot-columns can be used as the wiring regions to form the wirings which will connect the macro cell with other macro cells. In this way, in the gate array shown in FIG. 5, the macro cell is constituted by the basic cell and the MOS transistors existing adjacent to both sides of the basic cell; and, at the same time, partial regions of these MOS transistors are used as wiring regions. In other words, although the effective width of the macro cell is twenty-four grids, the regions having a width of three grids on the sides of the left and right ends are not used as internal wirings to interconnect the MOS transistors of the macro cell, so that they can be used as the external wiring regions which connect the MOS transistors of the macro cell with the MOS transistors of a different macro cell.

Thus, the width actually occupied by this macro cell is eighteen grids. For instance, in the gate array shown in FIG. 1, if two MOS transistors are formed in a line in the row direction, the width of about eighteen grids is needed in consideration of the existence of the diffusion region 7-1 or 7-2. On the other hand, in the gate array shown in FIG. 5, a total of four MOS transistors including two p-channel MOS transistors and two n-channel MOS transistors can be formed on a line in the row direction in the region of eighteen grids. As described above, the macro cell can be formed with a high degree of density. In addition, in this embodiment, two MOS transistors are serially coupled in a column direction in the basic cell; however, more than two MOS transistors may be serially coupled. Further, although two MOS transistors of the same channel are formed on a line in the row direction in each basic cell, more than two MOS transistors may be formed on a line.

FIG. 5 shows a latch circuit device including MOS transistors of high load driving capability. Practically speaking, in the latch circuit device, since two MOS transistors of the same channel are adjacently arranged in the row direction, a power transistor in the macro cell can be constituted by connecting, in parallel, these two same channel MOS transistors, and a power MOS transistor having a current path with a width of eight grids can be equivalently constituted. Consequently, the power MOS transistor can be driven with a high load driving capability with respect to the next stage circuit. For example, a single gate such as an inverter, a NAND gate, a NOR gate, or the like, can be advantageously constituted by MOS transistors having a high load driving capability in the macro cell.

In the latch circuit shown in FIG. 6, MOS transistors Q1, Q3, Q9, Q10, Q11 and Q12 are of the n-channel type and MOS transistors Q2 and Q4 to Q8 are of the p-channel type. Input terminals D and CP and output terminals Q and $\overline{Q}$ correspond to those shown in FIG. 5. In addition, the p-channel transistors Q5 and Q6; Q7 and Q8; and n-channel transistors Q9 and Q10; Q11 and Q12 are coupled in parallel and constitute the MOS transistors having a high load driving capability.

In the case of forming a multi-stage gate circuit, such as a latch circuit, flip-flop circuit or the like, the MOS transistor which is used as the output stage gate to which the parasitic capacitance associated with the metal wirings in the macro cell and gate capacitance at the next stage are coupled as loads is formed to have a current path whose width is set at eight grids. The width of the current path of other MOS transistors which are not required to have a high driving capability in the macro cell is set at four grids. Therefore, a latch circuit having a high load driving capability can be formed with a high degree of density. A logic circuit such as a D-type flip-flop circuit can also be similarly formed.

In the embodiment shown in FIG. 4, the p- or n-channel MOS transistors are symmetrically formed on two columns in the n- or p-type substrate region 10N or 10P, so that the basic cell can be easily formed with the p-channel MOS transistors arranged on the left side and the n-channel MOS transistors arranged on the right side, or, conversely, with the n-channel MOS transistors arranged on the left side and the p-channel MOS transistors arranged on the right side. Thus, the design and arrangement of the macro cell can be freely selected.

Figure 7:
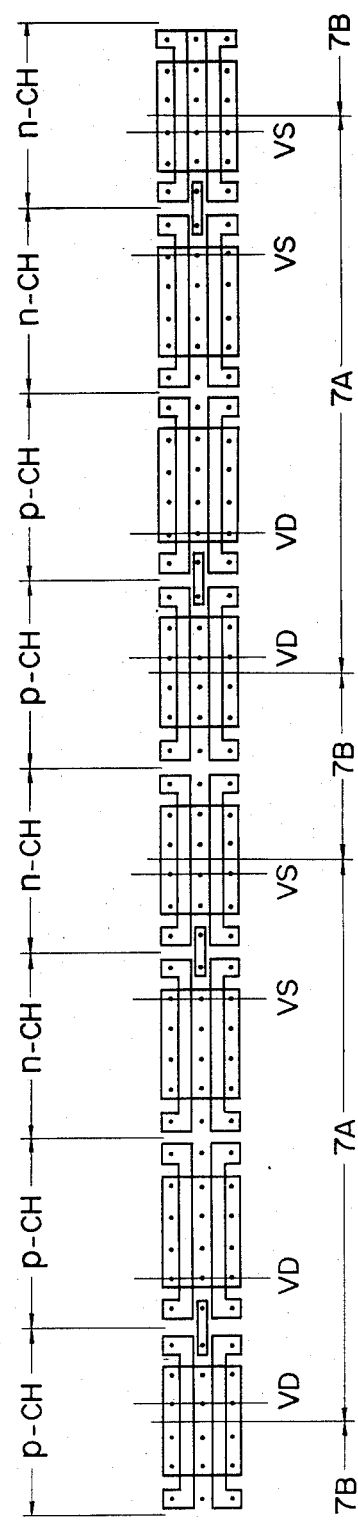
FIG. 7 is a diagram showing divisions in the row direction of the macro cell region and wiring region.

FIG. 7 shows a range 7A in the row direction of the macro cell region and a range 7B in the row direction of the wiring region. In FIG. 7, the range 7A of the macro cell region in the row direction is determined to be eighteen grids, while the range 7B of the wiring region in the row direction is decided to be six grids. The range of this wiring region can be extended in the row direction on a 12-grid unit basis. For instance, in the case of extending by twenty-four grids, the macro cell region 7A in FIG. 7 and the wiring regions 7B on both sides of the region 7A are allocated as a single wiring region. When extending by twelve grids, the arrangement of the p- and n-channel MOS transistors in a macro cell region located on the left side of this wiring region of eighteen grids is inverted with respect to the position of the p- and n-channel MOS transistors in a macro cell region located on the right side of the wiring region.

When forming a circuit such as a RAM, a ROM, a PLA, or the like, it is not required that the MOS transistors be connected in parallel. Similarly, such complicated wirings as those required for the ordinary cell region are not required as power supply lines. Consequently, the MOS transistor can be formed as a small MOS transistor with a high degree of density.

Although the present invention has been described in the above with respect to one embodiment, the invention is not limited to only this embodiment. For example, although the width of the current path of the MOS transistor is set at four grids, it may be set to another value, for instance, five grids.

What is claimed is:

1. A semiconductor integrated circuit comprising:
   a plurality of p- and n-type semiconductor areas alternately arranged in a row direction;
   a plurality of columns of p-channel MOS transistors formed in each of said n-type semiconductor areas, said p-channel MOS transistors in each of said columns having current paths which are serially connected and having gate electrodes which are independently formed to extend in parallel in a row direction;
   a plurality of columns of n-channel MOS transistors formed in each of said p-type semiconductor areas, said n-channel MOS transistors in each of said columns having current paths which are serially connected and having gate electrodes which are independently formed to extend in parallel in a row direction;
   a plurality of n-type regions arranged on the same column, each of said n-type regions being formed in a position surrounded by the gate electrodes of two p-channel MOS transistors in each of two of said p-channel MOS transistor columns adjacent to each other in a row direction; and
   a plurality of p-type regions arranged in the same column, each of said p-type regions being formed in a position surrounded by the gate electrodes of two n-channel MOS transistors in each of two of said n-channel MOS transistor columns adjacent to each other in a row direction.

2. A semiconductor integrated circuit according to claim 1, wherein the number of the MOS transistors in each of said p- and n-channel MOS transistor columns is 2.

3. A semiconductor integrated circuit according to claim 2, wherein each of said MOS transistor columns comprises two adjacent columns of transistors.

4. A semiconductor integrated circuit according to claim 3, wherein each of said MOS transistors is formed to have a current path whose width is equal to four grids.

5. A semiconductor integrated circuit according to claim 2, wherein each of said MOS transistors is formed to have a current path whose width is equal to four grids.

6. A semiconductor integrated circuit according to claim 1, wherein each of said MOS transistors is formed to have a current path whose width is equal to four grids.

7. A semiconductor integrated circuit according to claim 1, wherein each of said MOS transistor columns comprises two adjacent columns of transistors.

* * * * *